(12) United States Patent
Phung et al.

(10) Patent No.: US 12,327,164 B2
(45) Date of Patent: Jun. 10, 2025

(54) MECHANICALLY TOLERANT COUPLERS

(71) Applicant: INTERNATIONAL BUSINESS MACHINES CORPORATION, Armonk, NY (US)

(72) Inventors: Timothy Phung, Milpitas, CA (US); Muir Kumph, Croton on Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 656 days.

(21) Appl. No.: 17/740,292

(22) Filed: May 9, 2022

(65) Prior Publication Data

US 2023/0359918 A1    Nov. 9, 2023

(51) Int. Cl.
*G06N 10/40* (2022.01)
*H01L 23/522* (2006.01)
*H01L 23/64* (2006.01)
*H01L 25/065* (2023.01)

(52) U.S. Cl.
CPC ......... *G06N 10/40* (2022.01); *H01L 23/5227* (2013.01); *H01L 23/642* (2013.01); *H01L 23/645* (2013.01); *H01L 25/0655* (2013.01)

(58) Field of Classification Search
CPC .......... G06N 10/40; H04B 5/26; H04B 5/263; H04B 5/266; H04B 5/24; H04B 5/22; H01L 23/645; H01L 23/642; H01L 25/0655; H01F 2038/143; H01F 2017/0086; H01F 38/14
See application file for complete search history.

(56) References Cited

U.S. PATENT DOCUMENTS

| 7,330,702 | B2 | 2/2008 | Chen et al. | |
| 9,596,008 | B2* | 3/2017 | Mukherjee | H01L 23/645 |
| 9,953,269 | B2 | 4/2018 | Chow et al. | |
| 10,304,005 | B2 | 5/2019 | Chow et al. | |
| 10,950,654 | B2 | 3/2021 | Kelly et al. | |
| 2017/0092603 | A1* | 3/2017 | Kuroda | H01L 23/645 |
| 2018/0013052 | A1* | 1/2018 | Oliver | H10N 60/805 |

(Continued)

FOREIGN PATENT DOCUMENTS

| CN | 112331693 A | 2/2021 |
| EP | 3 937 093 A1 | 7/2020 |
| WO | 2017131831 A2 | 8/2017 |

OTHER PUBLICATIONS

Rosenberg. D. et al., "3D Integrated Superconducting Qubits" NPJ Quantum Information (2017), vol. 1:9, 5 pgs.

(Continued)

*Primary Examiner* — Alia Sabur
(74) *Attorney, Agent, or Firm* — Intelletek Law Group, PLLC; Gabriel Daniel, Esq.

(57) ABSTRACT

A modular electronic structure includes a first chip having a first interleaved portion and a first electromagnetic coupler on the first interleaved portion. There is a second chip having a second interleaved portion and a second electromagnetic coupler on the second interleaved portion and configured to electromagnetically couple with the first electromagnetic coupler. The first interleaved portion fits between two surfaces of the second chip. The second interleaved portion fits between two surfaces of the first chip.

20 Claims, 12 Drawing Sheets

(56) References Cited

U.S. PATENT DOCUMENTS

| | | | | |
|---|---|---|---|---|
| 2018/0323133 A1* | 11/2018 | Kirby | .................. | H01L 23/5227 |
| 2020/0402912 A1* | 12/2020 | Arvin | .................. | H01L 23/5386 |
| 2021/0342729 A1 | 11/2021 | Scheer et al. | | |
| 2023/0162080 A1* | 5/2023 | Kikuchi | ................ | G06N 10/40 |
| | | | | 716/100 |

OTHER PUBLICATIONS

International Search Report issued Sep. 13, 2023 in related international patent application No. PCT/EP2023/062124, 6 pgs.

Gold, A. et al., "Entanglement Across Separate Silicon Dies in a Modular Superconducting Qubit Device"; NJP Quantum Information (2021); vol. 7:142; 10 pgs.

Culurciello, E. et al., "Capacitive Inter-Chip Data and Power Transfer for 3-D VLSI"; IEEE Transactions on Circuits and Systems—II: Express Briefs (2006), vol. 53:12; pp. 1348-1352.

Gold, A. et al., "Entanglement Across Separate Silicon Dies in a Modular Superconducting Qubit Device"; NPJ Quantum Information (2021); vol. 7:142, 10 pgs.

Miura, N. et al., "Analysis and Design of Inductive Coupling and Transceiver Circuit for Inductive Inter-Chip Wireless Superconnect"; IEEE Journal of Solid-State Circuits (2005); vol. 40:4, pp. 829-837.

Zhou, C. et al., "A Modular Quantum Computer Based on a Quantum State Router"; arXiv:2109.06848v2 [quant-ph] (2022) 21 pgs.

\* cited by examiner

| Design | Mutual Inductance (pH) | Self Inductance (nH) |
|---|---|---|
| No hole (reference) | 42 | 1.52 |
| 2 mm x 2 mm hole in PCB | 245 | 1.87 |
| slots | 197 | 1.76 |

FIG. 8

MECHANICALLY TOLERANT COUPLERS

BACKGROUND

Technical Field

The present disclosure generally relates to quantum computing, and more particularly, to superconducting chips having mechanically tolerant couplers.

Background Information

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

The ability to include more superconducting qubits is salient to being able to realize the potential of quantum computers. However, it is challenging to yield quantum processors on a monolithic qubit chip that have desired qubit characteristics, such as frequency, fidelity, etc. A modular architecture comprising smaller modular units of devices that are interconnected can make it more feasible to realize a large-scale quantum processor.

However, such modular architecture will require connections between qubits on separate physical chips. Some salient considerations include the connection or coupling between the qubit to be low loss (e.g., high Q) in order not to degrade the qubit performance. Secondly, the coupling if done in a non-galvanic way, such as by capacitive or inductive coupling, will be sensitive to the exact relative positioning of the qubit chips. Various quantum phenomena, such as superposition and entanglement, do not have analogs in the world of classical computing and therefore may involve special structures, techniques, and materials.

SUMMARY

The following summarizes exemplary, non-limiting embodiments. According to one embodiment, a modular electronic structure includes a first chip having a first interleaved portion and a first electromagnetic coupler on the first interleaved portion. There is a second chip having a second interleaved portion and a second electromagnetic coupler on the second interleaved portion and configured to electromagnetically couple with the first electromagnetic coupler. The first interleaved portion fits between two surfaces of the second chip. The second interleaved portion fits between two surfaces of the first chip. A loss of electromagnetic coupling between the first electromagnetic coupler and the second electromagnetic coupler due to a misalignment in position between the first electromagnetic coupler and the second electromagnetic coupler is substantially mitigated (e.g., kept within 5% change for a 300 um change in a direction X or Y). In this way, electromagnetic coupling between the two chips can be maintained despite a misalignment between the chips.

In one embodiment, the first chip and the second chip are on a same plane.

In one embodiment, a length of the first electromagnetic coupler in a first direction is longer than a length in the first direction of the second electromagnetic coupler. The mitigation of electromagnetic coupling from a misalignment in the first direction is based on a delta in length between the length in the first direction of the first electromagnetic coupler and the second electromagnetic coupler.

In one embodiment, the first and second chips are qubit chips and the electromagnetic coupling allows an entanglement between qubits of the first chip and the second chip.

In one embodiment, the electromagnetic coupling is capacitive.

In one embodiment, electromagnetic coupling is inductive.

In one embodiment, the electronic structure includes wirebonds coupled between a ground plane of the first chip and the second chip and configured to provide a flow of induced or eddy currents. These adjacent wirebonds can allow eddy currents to flow through them and facilitate recovery of mutual inductance between the coupler coils as well as provide reduced self-inductance.

In one embodiment, the electronic structure is modular in that additional chips can be added by way of electromagnetic coupling and/or any of the first or second chips replaced.

In one embodiment, the misalignment in position between the first electromagnetic coupler and the second electromagnetic coupler is substantially mitigated in two directions. In this way, despite the alignment being off in two coplanar directions, there is less than 5% in change in mutual inductance or capacitance for a 300 um change in the X or Y direction.

In one embodiment, the first and second chips are part of a modular architecture of a quantum computing system.

In one embodiment, at least one of the first or second inductors is a spiral inductor.

In one embodiment, there is a printed circuit board (PCB) to which the first and second chips are connected to.

In one embodiment, there is an opening on a ground plane around a region of the first and second electromagnetic couplers and/or there are slots on a ground plane around a region of the first and second electromagnetic couplers. By virtue of using a hole or slots, the mutual inductance and the self-inductance are substantially improved.

In one embodiment, a ground plane of the first chip has an opening around the first electromagnetic coupler and/or a ground plane of the second chip has an opening around the second electromagnetic coupler.

In one embodiment, there are one or more wirebonds between the ground plane of the first chip and the ground plane of the second chip, and configured to recover a mutual inductance between the first and second electromagnetic couplers.

In one embodiment, the first and second electromagnetic couplers are trenched into a substrate of the first and second chips, respectively.

According to one embodiment, a quantum computing system includes a first chip having a first electromagnetic coupler having a first length in a first direction. There is a second chip having a second electromagnetic coupler having a second length that is longer than the first length in the first direction and configured to electromagnetically couple with the first electromagnetic coupler. A loss of electromagnetic coupling between the first electromagnetic coupler and the second electromagnetic coupler due to a misalignment in the first direction between the first electromagnetic coupler and the second electromagnetic coupler is mitigated (e.g., kept within 5% change in mutual inductance or capacitance for a 300 um change in the first (e.g., X) direction). The mitigation of electromagnetic coupling from a misalignment in the first direction is based on a delta in length between the length in the first direction of the first electromagnetic coupler and the second electromagnetic coupler.

In one embodiment, the electromagnetic coupling is at least one of capacitive or inductive.

In one embodiment, the electronic structure is modular in that additional chips can be added by way of electromagnetic coupling and/or any of the first or second chips replaced.

In one embodiment, the loss of electromagnetic coupling between the first electromagnetic coupler and the second electromagnetic coupler is further substantially mitigated in a second direction that is perpendicular to the first direction.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 8 provides a table of simulation results for coupling coils above a hole and above slots, respectively, consistent with an illustrative embodiment.

DETAILED DESCRIPTION

Overview

Figure 1:
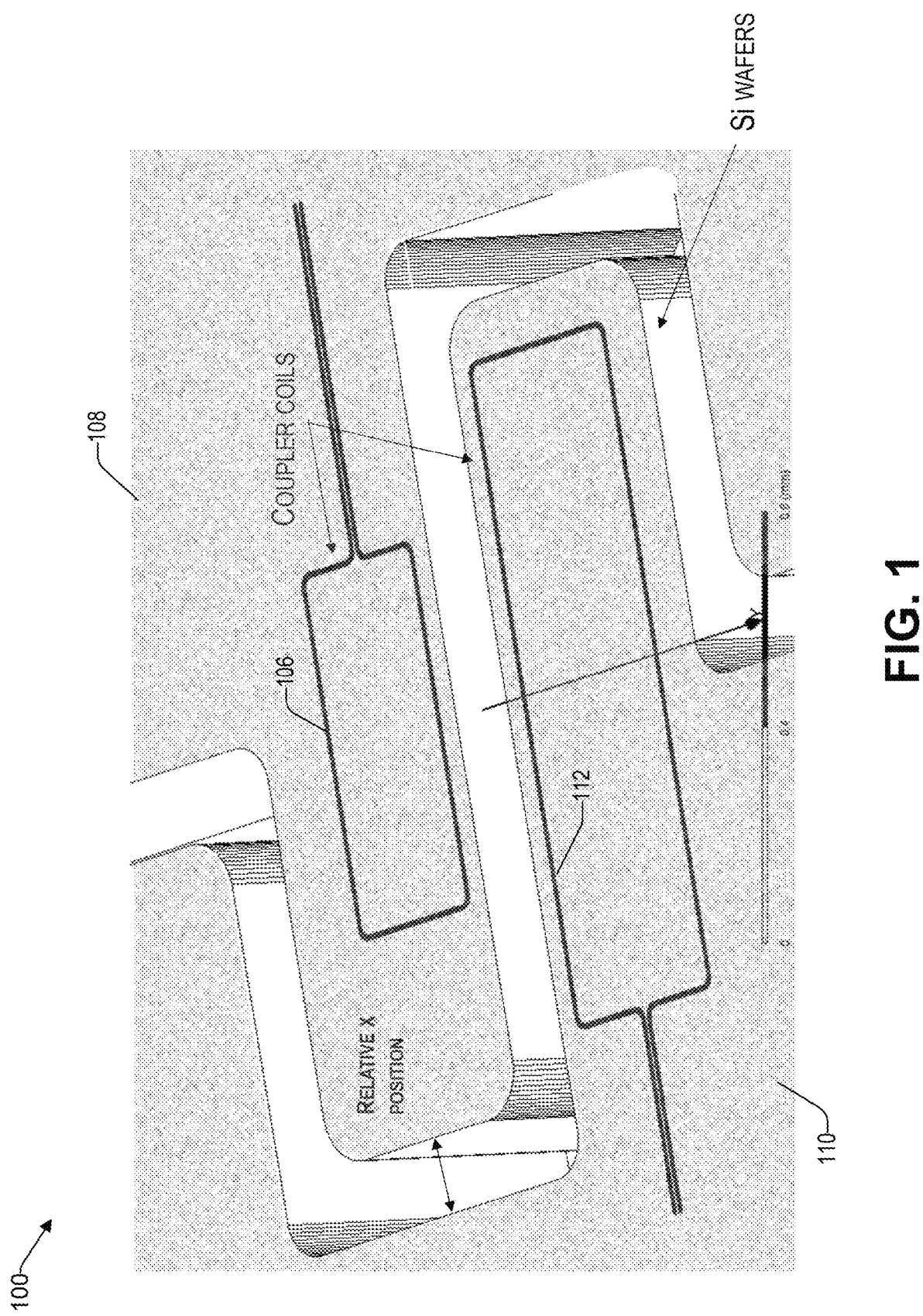
FIG. 1 illustrates a positionally insensitive inductive electronic structure, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In discussing the present technology, it may be helpful to describe various salient terms. As used herein a qubit represents a quantum bit and a quantum gate is an operation performed on a qubit, such as controlling the super-positioning between two qubits.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together. As used herein, the term "mechanically tolerant" relates to electrical properties not being significantly affected by the mechanical alignment between subject components.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

Although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure generally relates to superconducting devices, and more particularly, to superconducting chips having mechanically tolerant couplers. The electromagnetic energy associated with a qubit can be stored in so-called Josephson Junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. Alternatively, or in addition, a microwave signal (e.g., pulse) can be used to entangle one or more qubits. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons), and may be affected by cross-talk.

The ability to include more qubits is salient to being able to realize the potential of scalable quantum computers. Cross-talk between qubits and poor-quality connections between qubits can increase the error rate. In general, there are two main sources of gate errors, namely decoherence (stochastic) and non-ideal interactions (deterministic). The latter includes parasitic coupling, leakage to non-computational states, and control crosstalk.

Applicants have recognized that to increase the computational power and reliability of a quantum computer, improvements can be provided along two main dimensions. First, is the qubit count itself. The more qubits in a quantum processor, the more states can in principle be manipulated and stored. Second is low error rates, which is relevant to manipulate qubit states accurately and perform sequential operations that provide consistent results and not merely unreliable data. Thus, to improve fault tolerance of a quantum computer, a large number of physical qubits should be used to store a logical quantum bit. In this way, the local information is delocalized such that the quantum computer is less susceptible to local errors and the performance of measurements in the qubits' eigenbasis, similar to parity checks of classical computers, thereby advancing to a more fault tolerant quantum bit.

As mentioned previously, in recent years, there is an active interest in increasing qubit count in a quantum processor. Implementation of a quantum processor on a monolithic qubit chip is challenging. Although modular architectures using smaller units of quantum devices that are interconnected have been contemplated to realize a large-scale quantum processor, they typically are sensitive to the exact alignment between the quantum chips and suffer from quality issues (e.g., low Q), which can degrade the qubit performance, including its speed, fidelity, and coherence.

Accordingly, the teachings herein provide a methods and systems of providing a high Q, non-galvanic, and substantially position insensitive qubit coupling, which can facilitate the realization of scalable quantum processors out of smaller modular units with higher yield and reduced tolerances on frequency control. Such systems may also be field repaired in cases where there are broken or defective modules, without resorting to replacing an entire quantum processor.

This position insensitivity, sometimes referred to herein as mechanical tolerance, facilitates achieving a substantially constant (e.g., e.g., less than 5% change in mutual inductance or capacitance for a 300 um change in the X direction) and predictable coupling between devices (e.g., quantum chips) despite having the relative positioning of the devices being off from the target values either due to mechanical tolerances during assembly and/or thermal contraction/expansion from mismatch in thermal properties of materials of the devices.

In one aspect, the teachings herein facilitate a modular architecture, which makes engineering and realizing a large quantum computing system considerably more tractable. Electromagnetic couplers are provided that are position insensitive (e.g., mechanically tolerant). Such flexibility is salient to allow coupling across modules through non-galvanic coupling as there can be thermal mismatch leading to change in the qubit coupling from designed values.

In one aspect, the teachings herein are based on the inventors' insight that directly applying conventional integrated circuit techniques for interacting with computing elements to superconducting quantum circuits may not be effective because of the unique challenges presented by quantum circuits that are not presented in classical computing architectures. Indeed, many of the systems and architectures discussed herein are operated in a cryogenic environment and may involve superconductivity. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for interacting efficiently with qubits in a modular architecture. The techniques described herein may be implemented in a number of ways. Example implementations are provided below with reference to the following figures.

Example Configurations

FIG. 1 illustrates a positionally insensitive inductive electronic structure 100, consistent with an illustrative embodiment. There is a first chip 108 having a first interleaved portion and a first electromagnetic coupler 106 on the first interleaved portion. There is a second chip 110 having a second interleaved portion and a second electromagnetic coupler 112 on the second interleaved portion and configured to electromagnetically couple with the first electromagnetic coupler 106. In one embodiment, the second electromagnetic coupler 112 is larger (e.g., has a longer coil portion in a first direction X) than that of the first electromagnetic coupler 106. For example, a length of the first electromagnetic coupler 106 in a first direction (e.g., X) is longer than a length in the first direction of the second electromagnetic coupler 112. In this way, a loss of electromagnetic coupling between the first electromagnetic coupler and the second electromagnetic coupler is mitigated. In one embodiment, a mitigation of misalignment in the first direction (e.g., X) is based on a delta in length between the length in the first direction (e.g., X) of the first electromagnetic coupler 106 and the second electromagnetic coupler 112.

Figure 2:
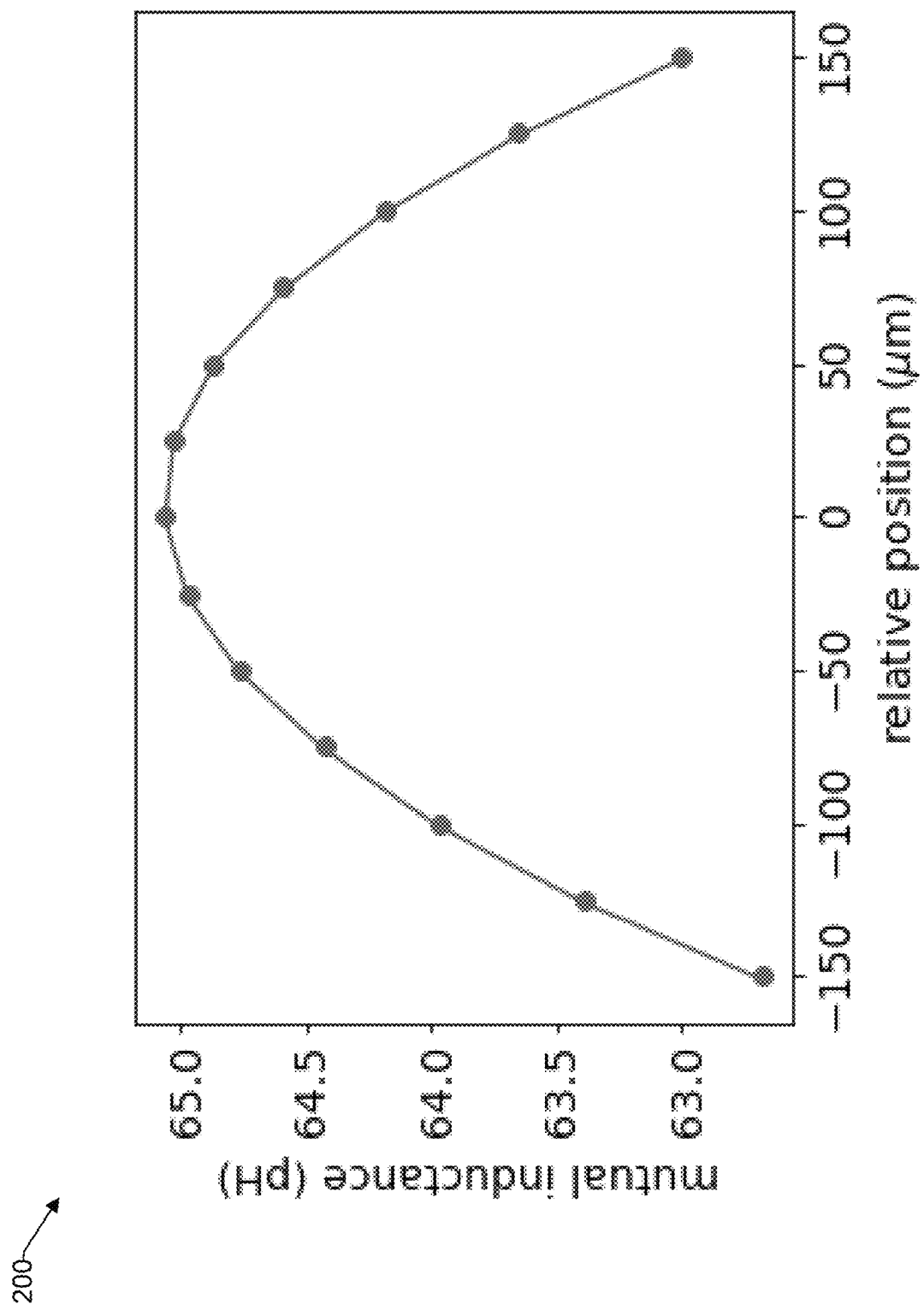
FIG. 2 is a graph of mutual inductance between coupler coils relative to a relative position in the X direction, consistent with an illustrative embodiment.

In one embodiment, the first chip 108 and the second chip 110 are on a same plane and are arranged such that the first coil 206 is substantially parallel to the second coil 112. The first interleaved portion fits between two surfaces of the second chip. Similarly, the second interleaved portion fits between two surfaces of the first chip 108. In the architecture of FIG. 1, when the first coil 106 and the second coil 112 (collectively sometimes referred to herein as the coupler coils) are misaligned in the relative position X (as the bottom of the first coil slides adjacent to the top of the second coil 112), such misalignment does not significantly affect the mutual inductance between the coupler coils 106/112. In this regard, FIG. 2 provides a graph 200 of mutual inductance between the coupler coils 106/112 relative to a position in the X direction, consistent with an illustrative embodiment. As shown in the graph 200, as the relative position X varies between −150 um to 150 um from a center position, the mutual inductance only varies by about 2 pH. Accordingly, one of the chips (e.g., 108/110) can be moved relative to the other in a first direction (e.g., X) without a significant change in coupling or mutual inductance.

Figure 3A:
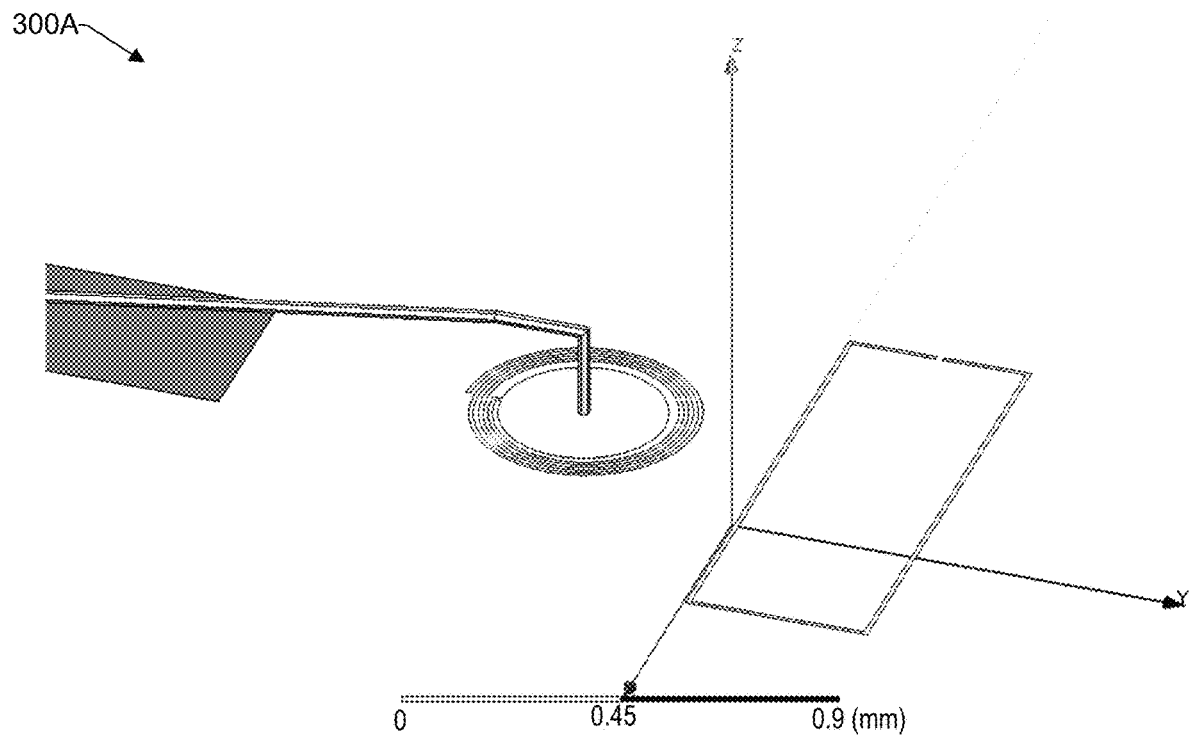
FIG. 3A illustrates a positionally insensitive inductive coupling with a spiral inductor, consistent with an illustrative embodiment.
Figure 3B:
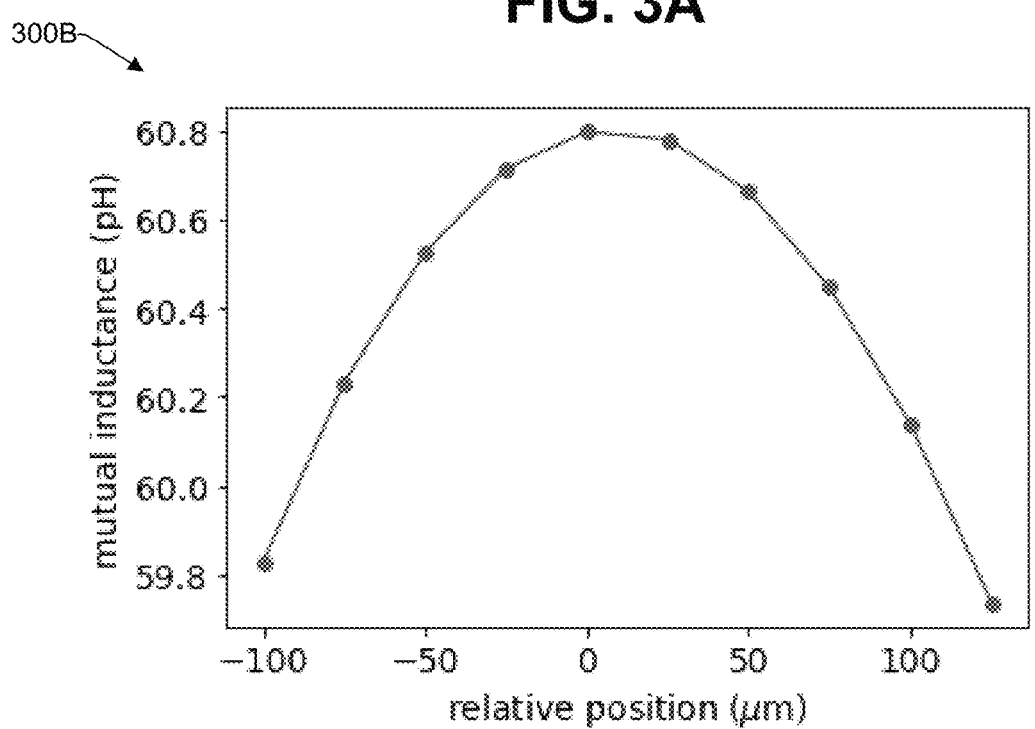
FIG. 3B is a graph of mutual inductance between a spiral inductor and a coupler coil, consistent with an illustrative embodiment.

In one aspect, the considerations for the width (e.g., X direction) include that if an electromagnetic coupler (e.g., 112) is too large, the inductor may no longer act as a lumped element, and if the inductance value is too large it can also load (e.g., change the properties of) the circuits it is connected to. Larger number of loops can increase coupling, but there are limitations such as circuit loading mentioned above. One coil is configured to be larger than the other such that when you slide the smaller coil along the X direction, the magnetic field/flux produced by the larger coil does not change much along the X direction While single loop electromagnetic inductors are illustrated in FIG. 1, it will be understood that spiral inductors can be used as well. In this regard, FIG. 3A illustrates a positionally insensitive inductive coupling with a spiral inductor 300A, consistent with an illustrative embodiment. In various embodiments, either one or both of the of the electromagnetic couplers can be spiral. FIG. 3B is a graph 300B of mutual inductance between a spiral inductor and a coupler coil (e.g., having a rectangular shape), consistent with an illustrative embodiment. As illustrated in FIG. 3B as the relative position X varies between −100 um to 100 um from a center position, the mutual inductance only varies by about 1 pH.

Figure 4A:
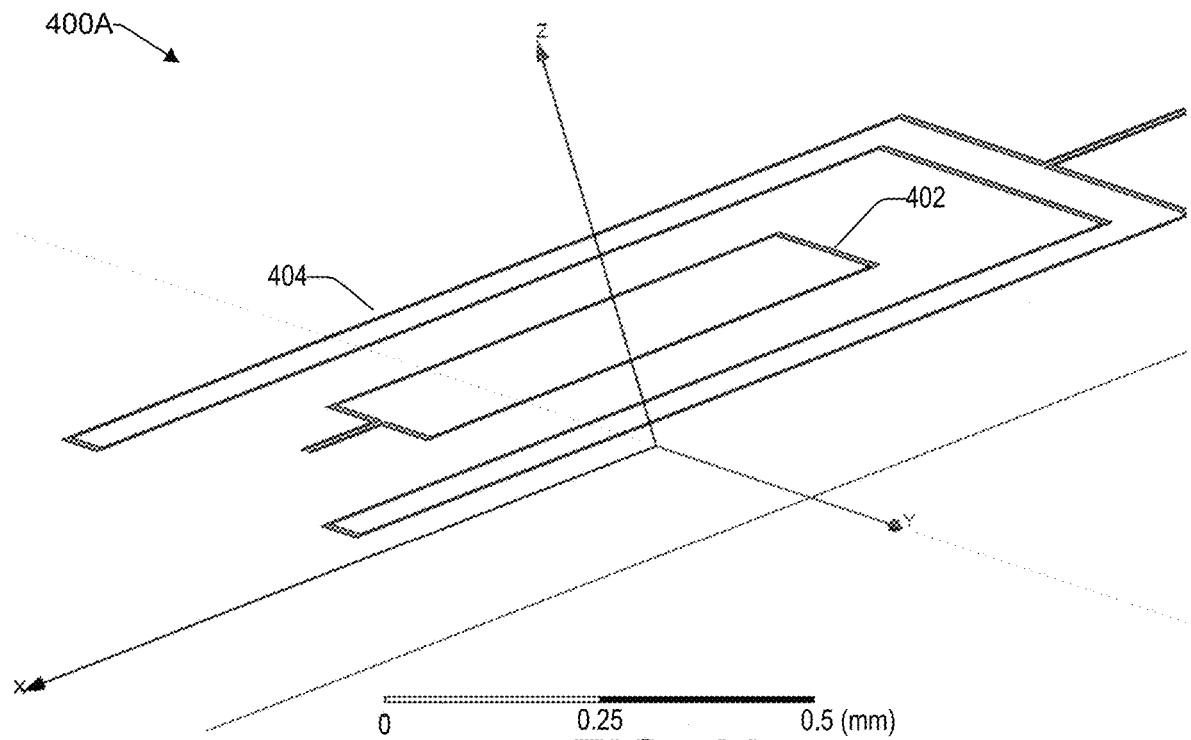
FIG. 4A illustrates an X and Y direction positionally insensitive inductive coupling, consistent with an illustrative embodiment.
Figure 4B:
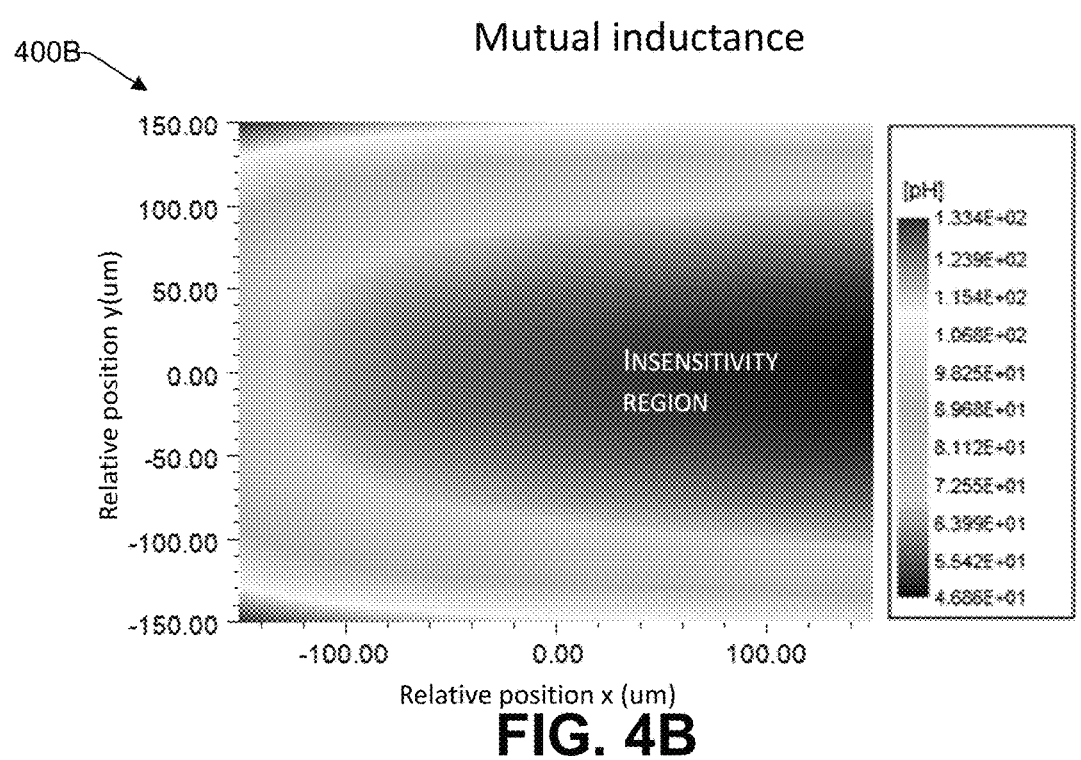
FIG. 4B provides a chart of the mutual inductance with respect to relative positions in both X and Y directions, consistent with an illustrative embodiment.

In some embodiments, positional insensitivity can be provided in two coplanar directions. In this regard, reference is made to FIG. 4A which illustrates a positionally insensitive inductive coupling 400A with X and Y position insensitivity, consistent with an illustrative embodiment. In the example of FIG. 4A, there is an inner electromagnetic coupler 402 associated with a first chip that is surrounded by three coplanar directions by an outer electromagnetic coupler 404, associated with a second chip. In this way, insensitivity in two coplanar directions (e.g., X and Y) can be provided. FIG. 4B provides a chart of the mutual inductance with respect to relative positions in both X and Y directions, consistent with an illustrative embodiment.

Figure 5A:
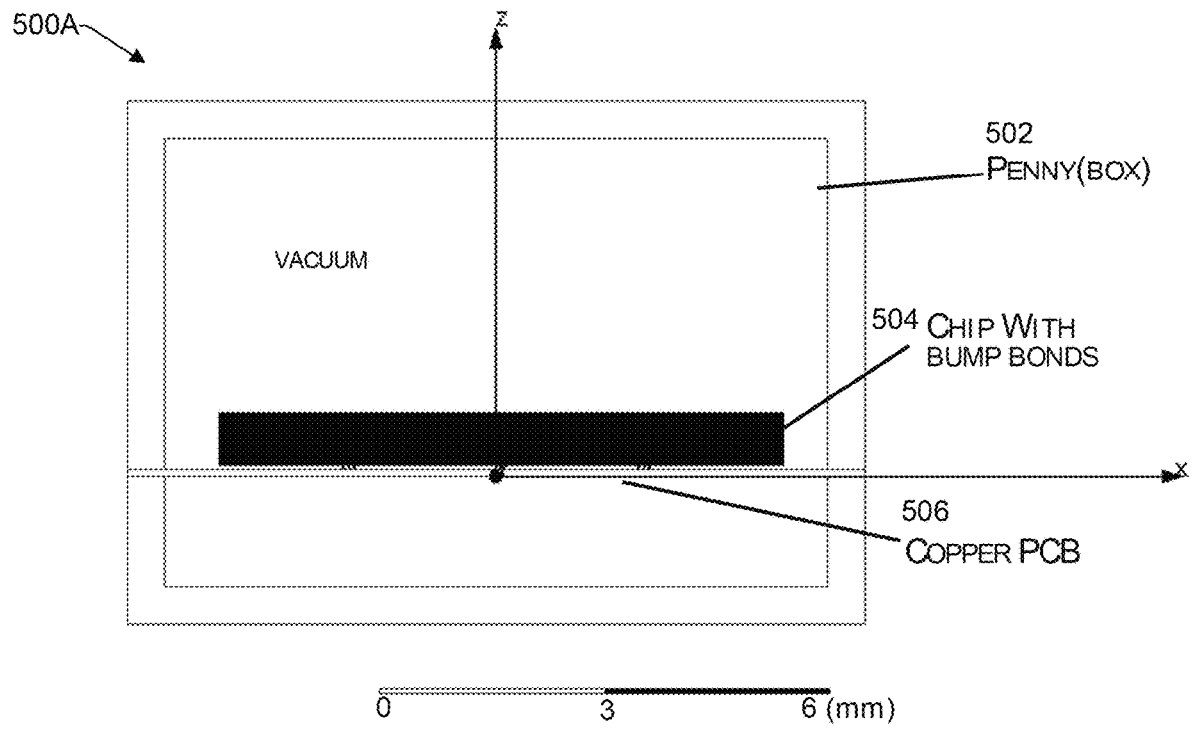
FIGS. 5A and 5B provide a cross-section view and a perspective view, respectively, of an inductively coupled system in a controlled environment, consistent with illustrative embodiments.
Figure 5B:
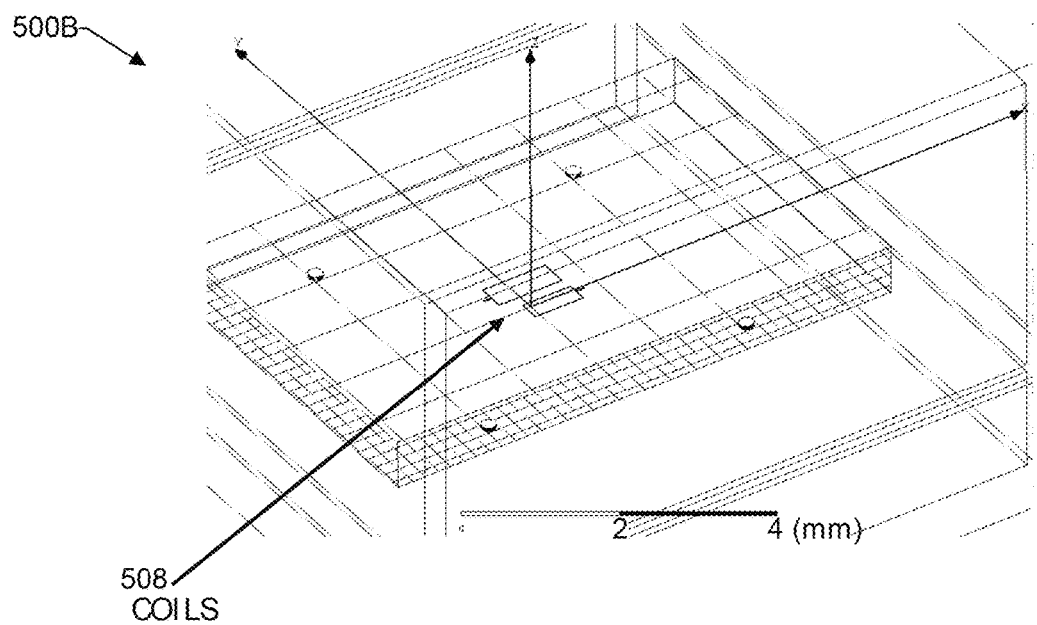

There are many grounded surfaces that can have induced radio frequency (RF) currents, which could ultimately affect the self and mutual inductance of electromagnetic couplers. In this regard, FIGS. 5A and 5B provide a cross-section view 500A and a perspective view 500B, respectively, of an inductively coupled system in a controlled environment, consistent with illustrative embodiments. For example, the system 500A/B can operate in a vacuum and/or cryogenic environment, which is shielded by a metallic enclosure, referred to in FIG. 5A as a pennybox 502. The pennybox 502 houses a chip 504, which may be coupled to a (e.g., copper) printed circuit board (PCB) 506 by way of bump bonds 504. To facilitate the present discussion and to avoid clutter a single chip is illustrated, while it will be understood that two separate chips can be coupled by the concepts discussed herein. For example, FIGS. 5A and 5B are used to better explain how the current flows in the ground plane when the ground plane is continuous, and we don't have separate chips. This allows us to illustrate why the introduction of wire-bonds for the separate chip case is useful. In addition, FIGS. 5A and 5B also help demonstrate how induced ground plane currents in the ground plane coplanar to the coil can affect the coupling between coils. The case of separate chips may not cleanly show how induced currents can flow in the ground plane since the separation may not permit them to flow in a loop.

Figure 6A:
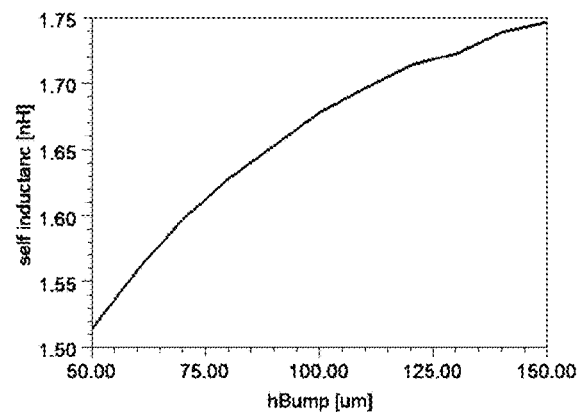
FIGS. 6A and 6B illustrate simulations of a self-inductance and a mutual inductance, respectively, of an electromagnetic coupler due to induced currents on the PCB, consistent with illustrative embodiments.
Figure 6B:
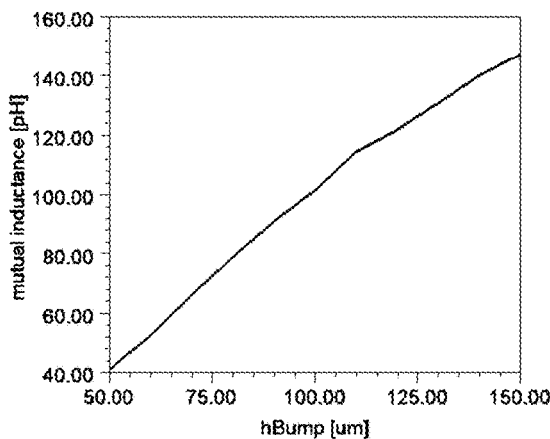
Figure 6C:
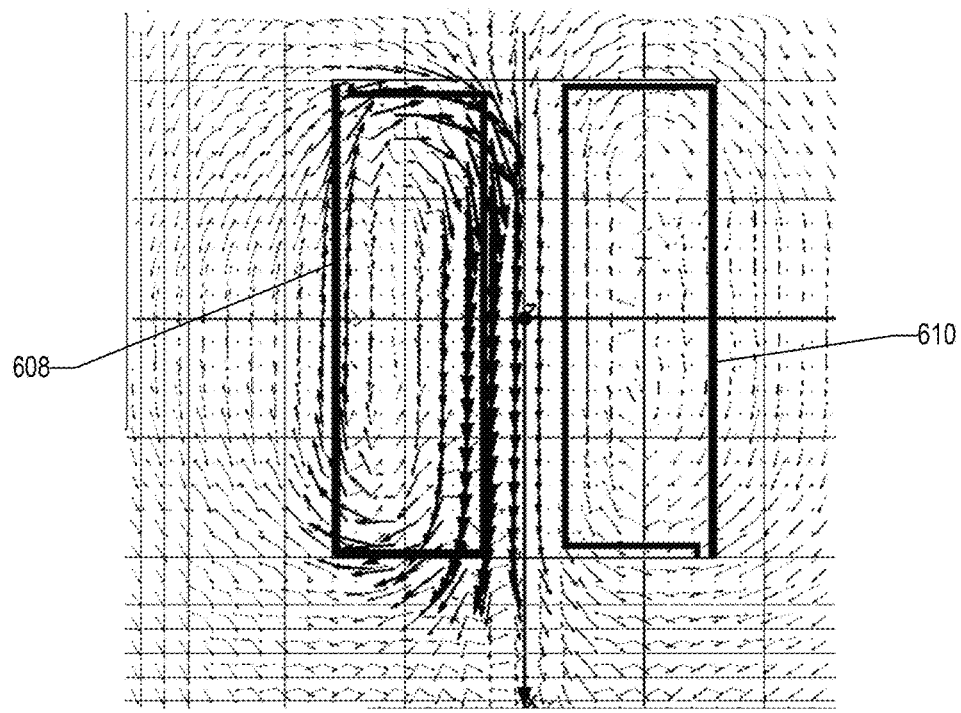
FIG. 6C illustrates simulations of a self-inductance and a mutual inductance, respectively, of an electromagnetic coupler due to induced currents on the PCB, consistent with illustrative embodiments.

The coils 508 of the electromagnetic couplers may be affected by the induced currents of the ground plane of the PCB or substrate of the chip(s) associated with each electromagnetic coupler. The induced currents of the PCB can be better understood in view of FIGS. 6A to 6C, which illustrate simulations of a self-inductance 600A and a mutual inductance 600B, respectively, of an electromagnetic coupler 600C due to induced currents on the PCB, consistent with illustrative embodiments. Accordingly, both the self (e.g., 600A) and mutual inductance (e.g., 600B) increase with bump height (e.g., induced currents on the package). Eddy currents induced on the (e.g., copper) PCB can also reduce the mutual and self-inductance (in this case, the induced currents cancel out the field). For example, with respect to FIG. 6C, if a current is provided in a counterclockwise direction on the left electromagnetic coupler (e.g., primary coil 608), there is an induced current on the PCB that is in the opposite direction as the induced current (e.g., counterclockwise direction). This parasitic induced current creates its own magnetic field that reduces the coupling with the secondary electromagnetic coupler (e.g., secondary coil 610). Various embodiments that address this issue are discussed below.

Figure 7A:
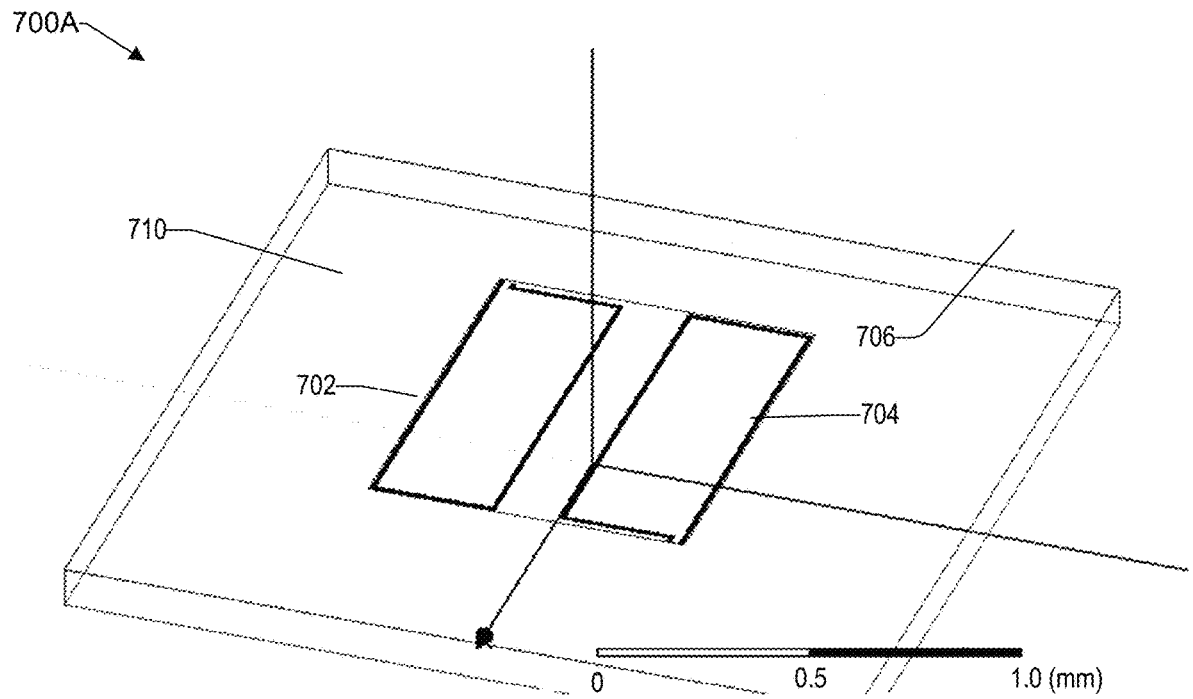
FIG. 7A provides a perspective view of coupling coils, where the printed circuit board to which the coupling coils are attached to include a hole around the region of the coupling coils, consistent with an illustrative embodiment.
Figure 7B:
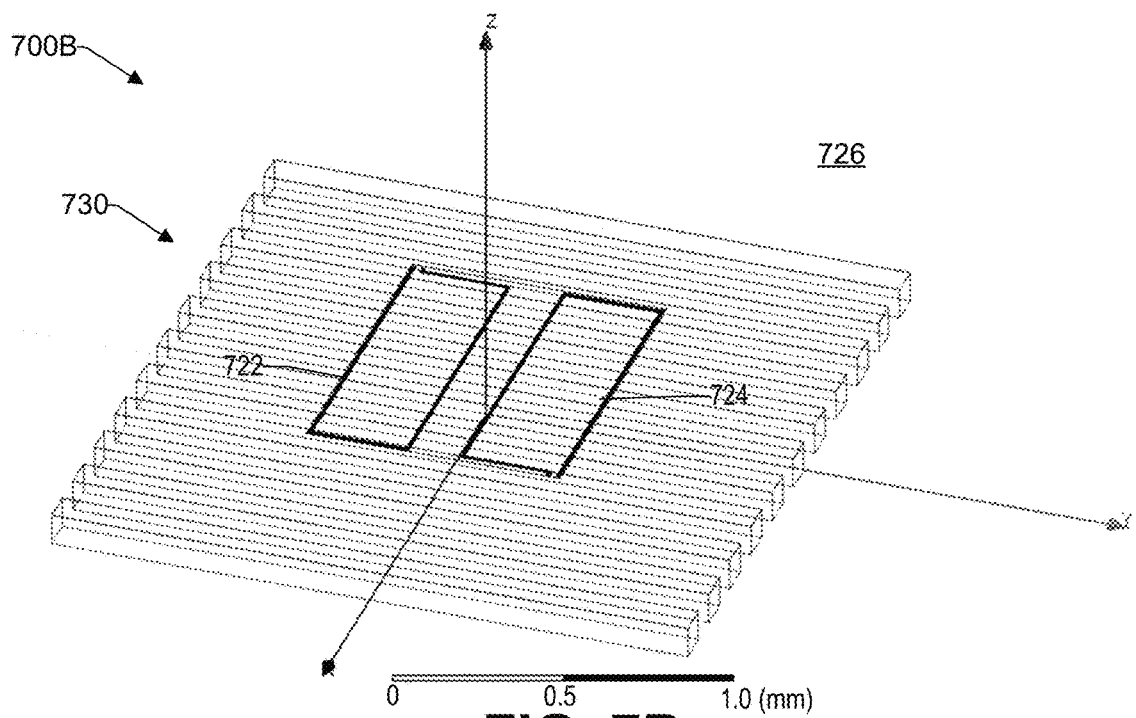
FIG. 7B provides a perspective view of coupling coils, where the printed circuit board to which the coupling coils are attached to include slots in the region of the coupling coils, consistent with an illustrative embodiment.

FIG. 7A provides a perspective view 700A of coupling coils 702 and 704, where the PCB 706, to which the coupling coils are attached to, includes a hole 710 (e.g., cutout or opening) around the region of the coupling coils, consistent with an illustrative embodiment. FIG. 7B provides a perspective view 700B of coupling coils 722 and 724, where the PCB 726 to which the coupling coils are attached to include slots 730 in the region of the coupling coils, consistent with an illustrative embodiment. By virtue of using a hole 710 or slots 730, the mutual inductance and the self-inductance are substantially improved. Example simulation results are provided in table 800 in FIG. 8.

Figure 9:
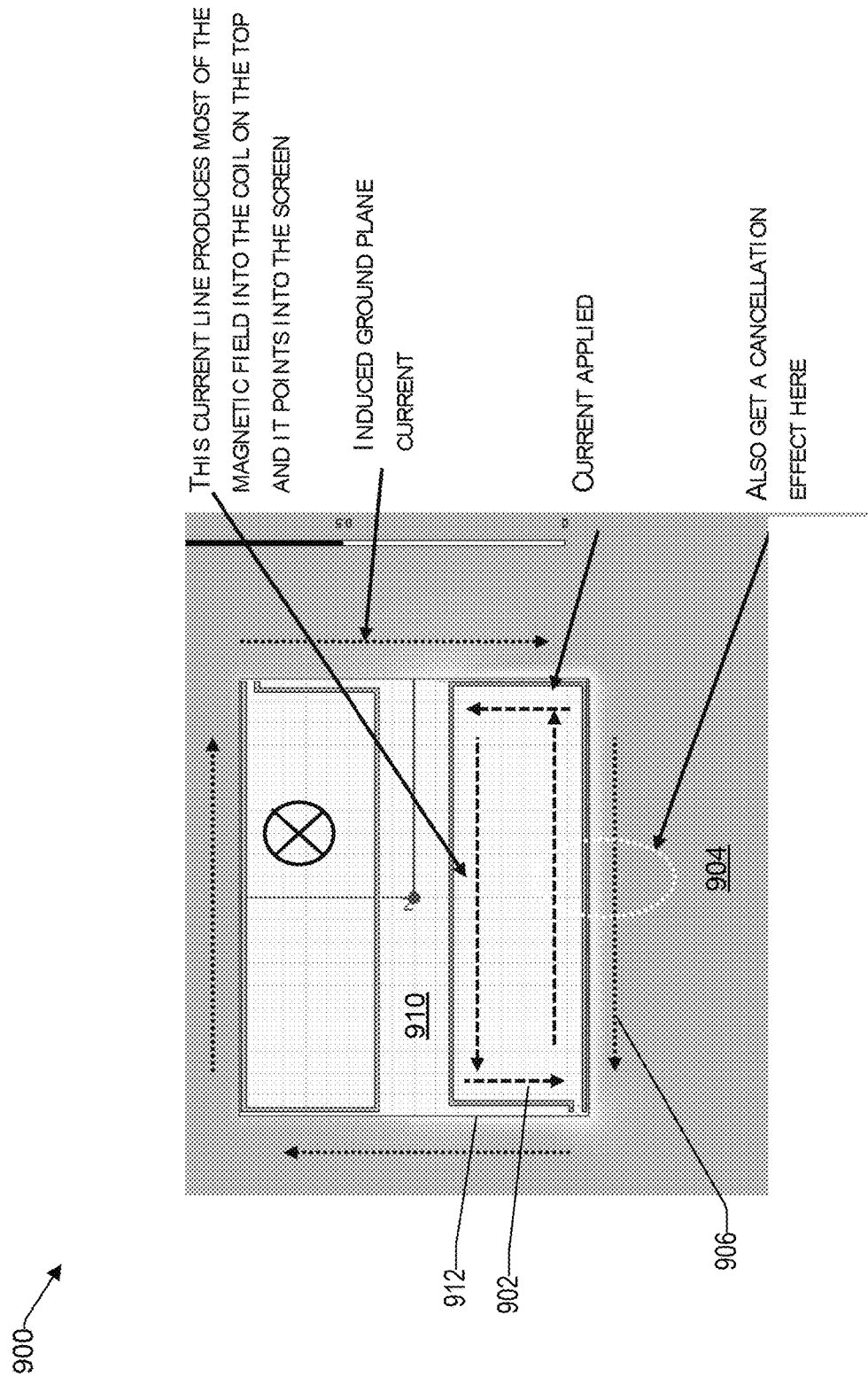
FIG. 9 provides a top view of an architecture having electromagnetic coupling with its ground plane that is below its electromagnetic couplers, consistent with an illustrative embodiment.

In various embodiments, the ground plane pocket size (opening in the chip itself around the electromagnetic coupler(s) of a chip) could be varied (e.g., increase the cutout in the X or Y direction) to lower the mutual inductance between the ground plane of the chip housing an electromagnetic coupler and its electromagnetic coupler. The self-inductance may exhibit an opposite effect. This concept can be better understood in view of FIG. 9, which provides a top view of an architecture having electromagnetic coupling with its ground plane that is below its electromagnetic couplers, consistent with an illustrative embodiment. While a single chip is illustrated for simplicity, to avoid clutter, and to facilitate efficient simulation, it will be understood that a coupling between two separate chips is within the scope of the present teachings.

For example, a current is applied to the bottom coupler coil 902 in the counter-clockwise direction. This applied current induces a counterclockwise current in the ground plane 904 that is in the counter-clockwise direction 906. The net effect is that the induced current reduced the self-inductance of the bottom coupler coil and the mutual inductance with the secondary coil (e.g., top coil). By virtue of including an opening 910 (e.g., cutout) in the ground plane 904 of the chip, the mutual inductance between the coupler coils is increased and the self-inductance is reduced, increasing the overall coupling between the coils. This can be understood by considering a test current flowing counterclockwise in the bottom coupler coil. This produces a magnetic field and magnetic flux pointing out of the page in the region of space enclosed by the coil. The induced current in the ground plane is in the clockwise direction and produces a magnetic field that points into the page and cancels out with the magnetic field that is produced by the test current in the bottom coil. The net effect of the applied current and induced current is to then reduce the self-inductance due to a partial cancellation of the magnetic fields generated by the test and induced current. The mutual inductance is increased because the magnetic field generated by the test and induced current add up in the region of space enclosed by the top coil.

Figure 10A:
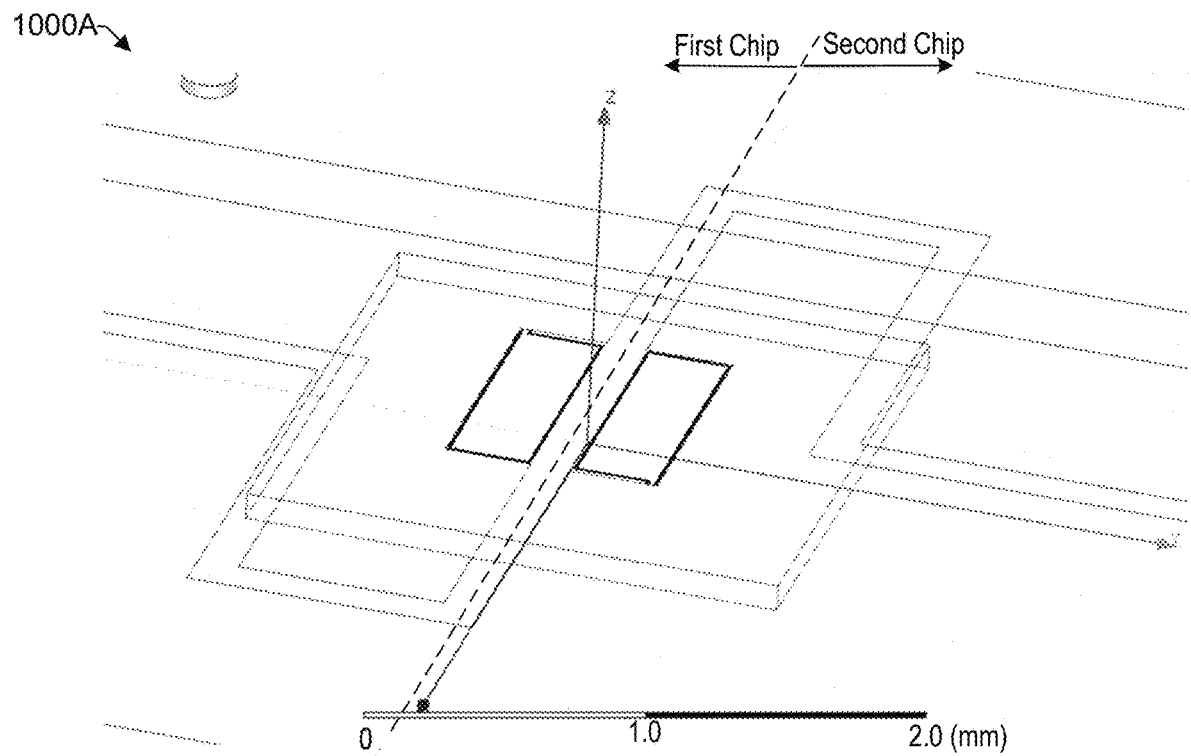
FIG. 10A provides a coupling architecture having two coupler coils in a ground plane opening without adjacent wirebonds, consistent with an illustrative embodiment.
Figure 10B:
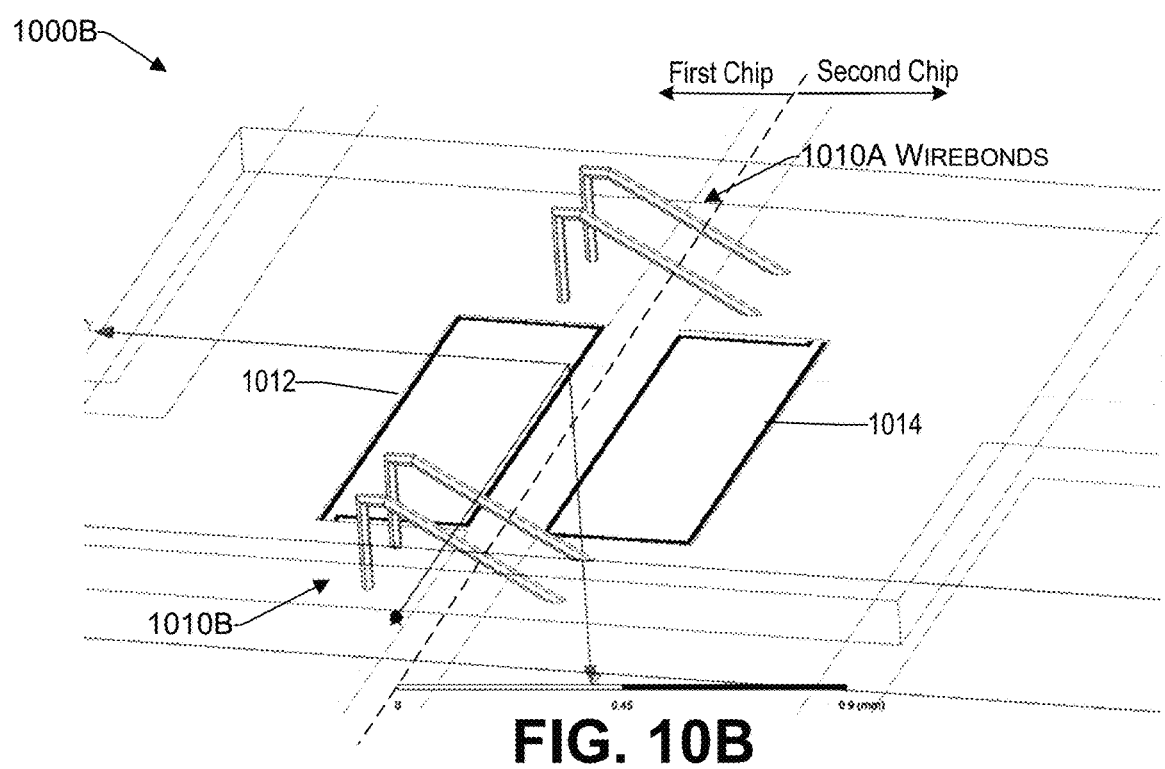
FIG. 10B provides an architecture having two coupler coils in a ground plane opening with adjacent wirebonds, consistent with illustrative embodiments.

By way of contrast FIG. 10A provides a coupling architecture having two coupler coils in a ground plane opening and in the same plane as the coupler coils, without adjacent wirebonds, and FIG. 10B provides an architecture having two coupler coils in a ground plane opening in the same plane as the coupler coils, with adjacent wirebonds 1010A/B, respectively, consistent with illustrative embodiments. The adjacent wirebonds 1010A and 1010B can be coupled to an electrical ground of the first chip (e.g., associated with a first electromagnetic coupler 1012), an electrical ground of the second chip (e.g., associated with a second electromagnetic coupler 1014), or both. In various embodiments, the adjacent wirebonds can have various shapes and may comprise different number. The adjacent wirebonds 1010A/B allow eddy currents to flow through them in a loop. If the eddy currents do not form a closed loop, they do not generate a magnetic field to give the magnetic field enforcing effects that allow increased mutual inductance. With the addition of the wirebonds for the case of separated chips, there is now a closed-circuit path from the separated ground planes. This is the loop being discussed here.

The architecture of FIG. 10B facilitates recovery of mutual inductance between the coupler coils 1012 and 1014 as well as reduced self-inductance. Stated differently, by providing a path for the eddy currents by way of the adjacent wirebonds 1010A/B, the mutual inductance is substantially improved (e.g., recovered) when there is an opening in the ground plane surrounding the coupler coils 1012 and 1014. The wirebonds 1010A and 1010B can also be used to electrically couple the ground planes of the first chip (e.g., associated with the first coupler coil 1012) and the second chip (e.g., associated with the second coupler coil 1014). While different number of wirebonds can be used on each side of the coupler coils 1012 and 1014, applicants have identified that having two wirebonds on each side provides a good tradeoff between effectiveness and material overhead/size.

Figure 11C:
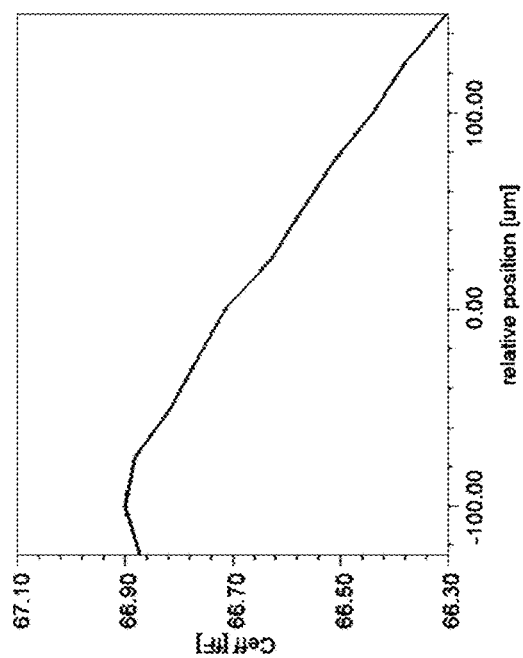
FIGS. 11C and 11D illustrate graphs of a change in capacitive coupling as a relative position X varies between −100 um to 100 um from a center position, consistent with illustrative embodiments.
Figure 11D:
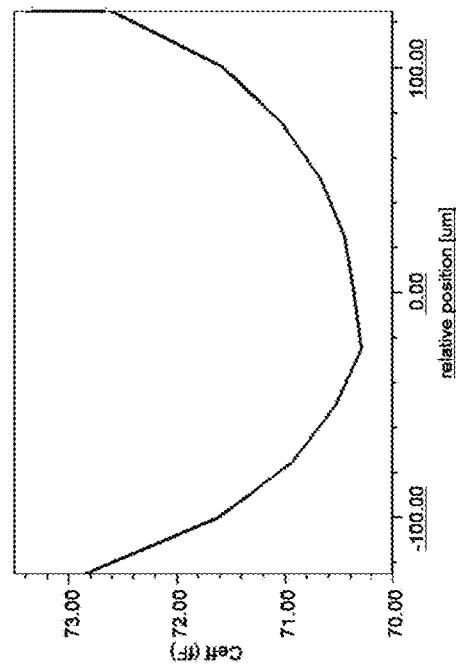
Figure 11A:
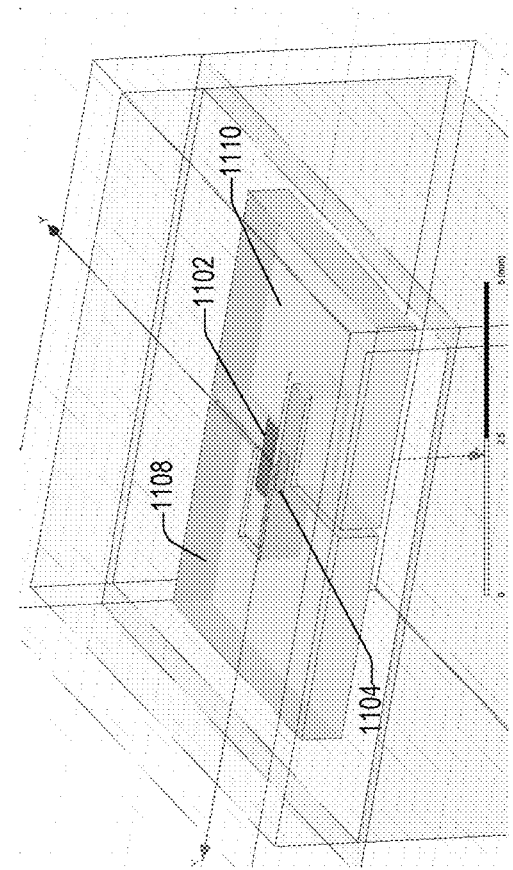
FIG. 11A provides a perspective view of a capacitive position insensitive coupler, consistent with an illustrative embodiment.
Figure 11B:
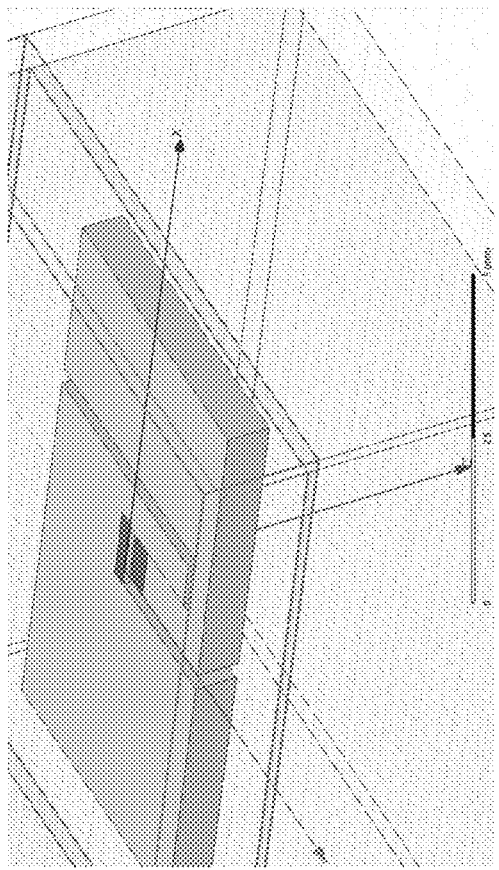
FIG. 11B provides a perspective view of another capacitive position insensitive coupler, consistent with an illustrative embodiment.

While the foregoing discussion largely is based on mutual inductance and the management thereof, capacitive position insensitive coupling is contemplated as well in addition to or independent thereof. In this regard, FIGS. 11A and 11B provide a perspective views of a capacitive position insensitive coupler, consistent with illustrative embodiments. FIGS. 11A and 11B provide, without limitation, two different example designs. FIGS. 11A and 11B illustrate different variations of positionally insensitive capacitive couplers. They operate using the same principles, but just have a difference in how the chips are separated.

For example, there may be a first electromagnetic coupler 1102, representing a first electrode of capacitive coupler, and a second electromagnetic coupler 1104, representing a second electrode of a capacitive coupler. The electromagnetic couplers 1102 and 1104 are arranged such that there is capacitive coupling between the first electrode and the second electrode. In one embodiment, the first electromagnetic coupler 1102 is larger (e.g., is longer in the X direction in the example of FIG. 11A) than the second electromagnetic coupler 1104. In this way, a loss of capacitive coupling between the first electromagnetic coupler 1102 and the second electromagnetic coupler 1104 is substantially mitigated. In this regard, FIGS. 11C and 11D provide graphs 1111 and 1113, respectively, of mutual capacitance between the electromagnetic couplers of FIGS. 11A and 11B, respectively, consistent with illustrative embodiments. As shown in the graphs of FIGS. 11C and 11D, as the relative position X varies between −100 um to 100 um from a center position, the mutual capacitance remains substantially the same (e.g., is below 3 fF). Accordingly, one of the chips (e.g., 1108) can be moved relative to the other (e.g., 1110) without a significant change in coupling or mutual capacitance.

Figure 12:
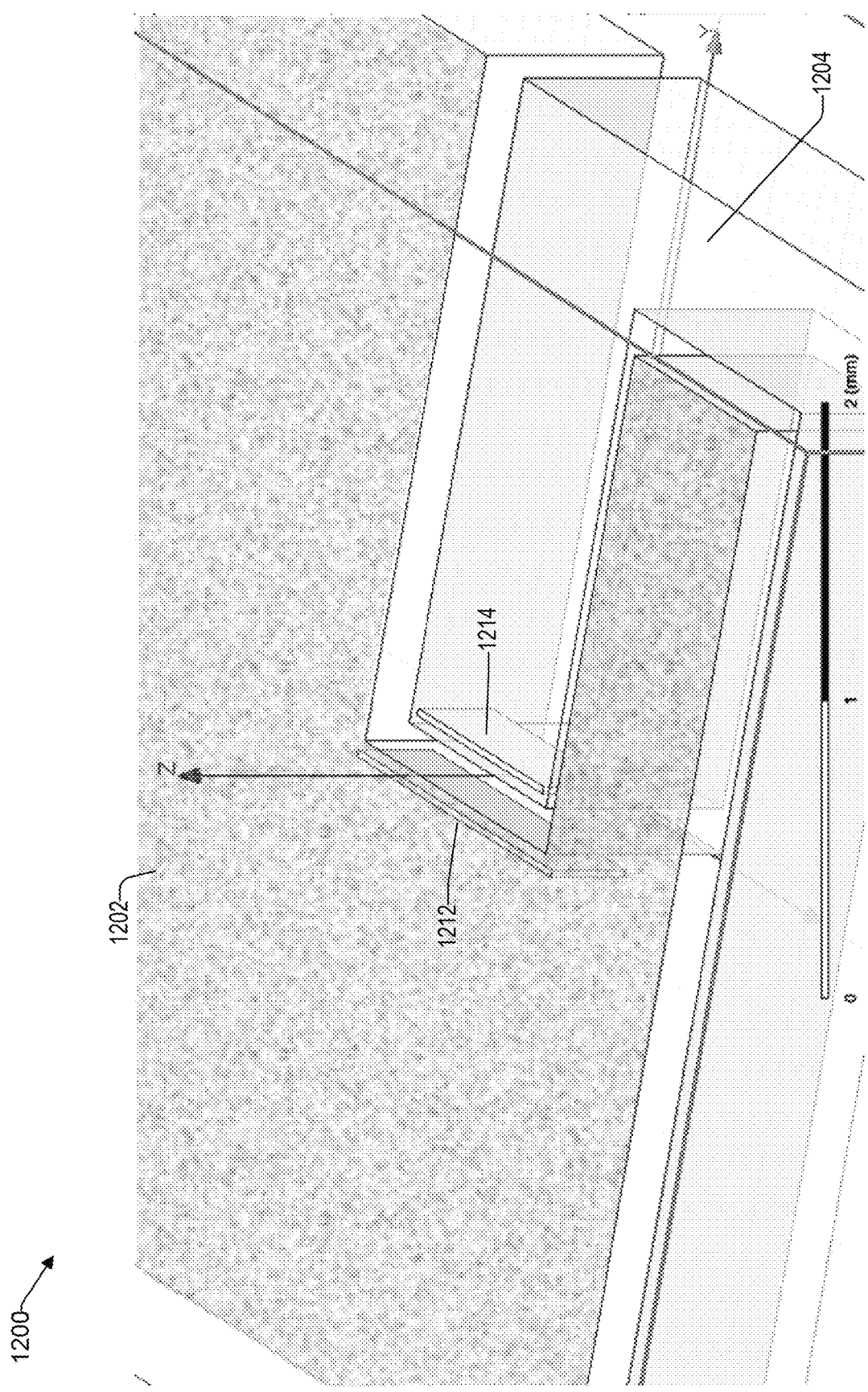
FIG. 12 illustrates an architecture having electromagnetic couplers that are trenched into the substrate, consistent with an illustrative embodiment.

FIG. 12 illustrates an architecture 1200 having metallization (e.g., electromagnetic coupler) that is trenched into the substrate, consistent with an illustrative embodiment. For example, there is a first electromagnetic coupler 1212 that is trenched towards the substrate of the first chip 1202. There is a second electromagnetic coupler 1214 that is trenched towards the substrate of the second chip 1204. The first electromagnetic coupler 1212 is larger (e.g., in surface) than that of the second electromagnetic coupler 1214. Any variation in capacitive coupling is largely mitigated by the architecture 1200 of FIG. 12. This trenched approach is applicable to both inductive and capacitive coupling. Accordingly, in various embodiments, the first and second electromagnetic couplers 1212 and 1214 can be capacitive node and/or inductive couplers (or coils).

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A modular electronic structure comprising:
   a first chip having a first interleaved portion and a first electromagnetic coupler on the first interleaved portion; and
   a second chip having a second interleaved portion and a second electromagnetic coupler on the second interleaved portion and configured to electromagnetically couple with the first electromagnetic coupler, wherein:
      the first interleaved portion fits between two surfaces of the second chip; and
      the second interleaved portion fits between two surfaces of the first chip.

2. The electronic structure of claim 1, wherein the first chip and the second chip are on a same plane.

3. The electronic structure of claim 1, wherein:
   a length of the first electromagnetic coupler in a first direction is longer than a length in the first direction of the second electromagnetic coupler; and
   a loss of electromagnetic coupling between the first electromagnetic coupler and the second electromagnetic coupler due to a misalignment in position between the first electromagnetic coupler and the second electromagnetic coupler in the first direction is substantially mitigated based on a delta in length between the length in the first direction of the first electromagnetic coupler and the second electromagnetic coupler.

4. The electronic structure of claim 1, wherein the first and second chips are qubit chips and the electromagnetic coupling allows an entanglement between qubits of the first chip and the second chip.

5. The electronic structure of claim 1, wherein the electromagnetic coupling is capacitive.

6. The electronic structure of claim 1, wherein the electromagnetic coupling is inductive.

7. The electronic structure of claim 1, further comprising wirebonds coupled between a ground plane of the first chip and the second chip and configured to provide a flow of induced or eddy currents.

8. The electronic structure of claim 1, wherein the electronic structure is modular in that additional chips can be added by way of electromagnetic coupling and/or any of the first or second chips replaced.

9. The electronic structure of claim 1, wherein the misalignment in position between the first electromagnetic coupler and the second electromagnetic coupler is substantially mitigated in two coplanar directions.

10. The electronic structure of claim 1, wherein the first and second chips are part of a modular architecture of a quantum computing system.

11. The electronic structure of claim 1, wherein at least one of the first or second inductors is a spiral inductor.

12. The electronic structure of claim 1, further comprising a printed circuit board (PCB) to which the first and second chips are connected to.

13. The electronic structure of claim 12, wherein at least one of:
   there is an opening on a ground plane around a region of the first and second electromagnetic couplers; or
   there are slots on a ground plane around a region of the first and second electromagnetic couplers.

14. The electronic structure of claim 1, wherein at least one of:
   a ground plane of the first chip has an opening around the first electromagnetic coupler; or
   a ground plane of the second chip has an opening around the second electromagnetic coupler.

15. The electronic structure of claim 14, further comprising one or more wirebonds between the ground plane of the first chip and the ground plane of the second chip, and configured to recover a mutual inductance between the first and second electromagnetic couplers.

16. The electronic structure of claim 1, wherein the first and second electromagnetic couplers are trenched into a substrate of the first and second chips, respectively.

17. A quantum computing system comprising:
   a first chip having a first electromagnetic coupler having a first length in a first direction; and
   a second chip having a second electromagnetic coupler having a second length that is longer than the first length in the first direction and configured to electromagnetically couple with the first electromagnetic coupler, wherein:
      a loss of electromagnetic coupling between the first electromagnetic coupler and the second electromagnetic coupler due to a misalignment in the first direction between the first electromagnetic coupler and the second electromagnetic coupler is mitigated; and
      the mitigation of electromagnetic coupling from a misalignment in the first direction is based on a delta in length between the length in the first direction of the first electromagnetic coupler and the second electromagnetic coupler.

18. The quantum computing system of claim 17, wherein the electromagnetic coupling is at least one of capacitive or inductive.

19. The quantum computing system of claim 17, wherein the electronic structure is modular in that additional chips can be added by way of electromagnetic coupling and/or any of the first or second chips replaced.

20. The quantum computing system of claim 17, wherein the loss of electromagnetic coupling between the first electromagnetic coupler and the second electromagnetic coupler is further mitigated in a second coplanar direction that is perpendicular to the first direction.

* * * * *